United States Patent
Kawa et al.

(10) Patent No.: US 11,133,045 B1
(45) Date of Patent: Sep. 28, 2021

(54) MAGNETORESISTIVE RANDOM ACCESS MEMORY (MRAM) BIT CELL WITH A NARROW WRITE WINDOW DISTRIBUTION

(71) Applicant: Synopsys, Inc., Mountain View, CA (US)

(72) Inventors: Jamil Kawa, Campbell, CA (US); Victor Moroz, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/752,261

(22) Filed: Jan. 24, 2020

Related U.S. Application Data

(60) Provisional application No. 62/796,309, filed on Jan. 24, 2019.

(51) Int. Cl.
| G11C 11/00 | (2006.01) |
| G11C 11/16 | (2006.01) |
| H01L 43/12 | (2006.01) |
| H01L 27/22 | (2006.01) |

(52) U.S. Cl.
CPC ........ *G11C 11/1659* (2013.01); *G11C 11/161* (2013.01); *G11C 11/1675* (2013.01); *H01L 27/228* (2013.01); *H01L 43/12* (2013.01)

(58) Field of Classification Search
CPC ............ G11C 11/1659; G11C 11/1675; G11C 11/161
See application file for complete search history.

(56) References Cited

U.S. PATENT DOCUMENTS

| 8,130,534 | B2 * | 3/2012 | Abu-Rahma | ....... G11C 11/1659 365/158 |
| 10,170,520 | B1 * | 1/2019 | Frougier | ............. H01L 29/7851 |
| 10,224,368 | B2 * | 3/2019 | Li | ........................ G11C 11/1675 |
| 10,707,347 | B2 * | 7/2020 | Yuan | ................... H01L 29/6684 |

* cited by examiner

*Primary Examiner* — Pho M Luu
(74) *Attorney, Agent, or Firm* — Park, Vaughan, Fleming & Dowler LLP; Laxman Sahasrabuddhe

(57) ABSTRACT

A bit cell is described. In some embodiments, the bit cell comprises (1) a magnetic tunnel junction (MTJ), and (2) an access transistor circuit coupled to the MTJ, wherein the access transistor circuit comprises a negative-capacitance field-effect-transistor.

3 Claims, 4 Drawing Sheets

MAGNETORESISTIVE RANDOM ACCESS MEMORY (MRAM) BIT CELL WITH A NARROW WRITE WINDOW DISTRIBUTION

RELATED APPLICATION

This application claims benefit of U.S. Provisional Application Ser. No. 62/796,309, filed on 24 Jan. 2019, the contents of which are herein incorporated by reference in their entirety for all purposes.

COPYRIGHT NOTICE

The assignee of this patent document does not object to the facsimile reproduction of the patent document as it appears in the files of the United States Patent and Trademark Office, but otherwise reserves all rights whatsoever in any included works of authorship protected by copyright.

BACKGROUND

Technical Field

This disclosure relates to MRAM technology. More specifically, this disclosure relates to an MRAM bit cell with a narrow write distribution.

Related Art

Advances in process technology have fueled a rapid increase in the size and complexity of integrated circuit (IC) designs. This dramatic increase in IC design complexity and integration densities has made it considerably more challenging to continue designing ICs at even greater integration densities. MRAM is a class of nonvolatile random-access memory technology that is commercially available today, but which began its development in the mid 1990s.

SUMMARY

This section is not intended to limit the scope of the disclosed subject matter. The disclosed subject matter is to be accorded the widest scope consistent with the principles and features disclosed in the entire disclosure.

Spin-transfer torque MRAM (STT-MRAM), also referred to as STT-RAM, ST-MRAM, or ST-RAM in the literature, is an advanced type of MRAM device. STT-MRAM has the potential to become a leading memory and storage technology as it is a high-performance memory (can challenge L2 and L3 SRAM caches) that can scale well below 10 nm and challenge the low cost of flash memory. Spin-orbit torque MRAM (SOT-MRAM) has the potential to advance the scope of STT-MRAM further in commercial applications, as it is a faster and more energy efficient memory technology. SOT-MRAM devices feature switching of a free magnetic layer, which is accomplished by injecting an in-plane current in an adjacent SOT layer; this is unlike STT-MRAMs where the current is injected perpendicularly into the STT layer and the read and write operations are performed through the same path.

Some embodiments described herein feature a fast STT-MRAM or SOT-MRAM bit cell, wherein the access transistor circuit in the bit cell comprises a negative-capacitance field-effect-transistor (NC-FET), which enables the bit cell to have a narrow write window distribution.

Specifically, some embodiments feature a bit cell comprising a magnetic tunnel junction (MTJ), and an access transistor circuit coupled to the MTJ, wherein the access transistor circuit comprises an NC-FET. In some embodiments, the access transistor circuit comprises a p-type metal-oxide-semiconductor (PMOS) field-effect transistor that is coupled in parallel with the NC-FET. In some embodiments, the access transistor circuit comprises an n-type metal-oxide-semiconductor (NMOS) field-effect transistor that is coupled in parallel with the NC-FET.

In some embodiments, the MTJ includes a floating magnetic layer (also referred to as a "free magnetic layer"; the terms "floating magnetic layer" and "free magnetic layer" are used interchangeably in this disclosure), one or more fixed magnetic layers, and one or more insulating layers disposed between adjacent magnetic layers. In some embodiments, a direction of injected current in the MTJ is perpendicular to a magnetization direction of the one or more fixed magnetic layers. In some embodiments, a direction of injected current in the MTJ is parallel or antiparallel to a magnetization direction of the one or more fixed magnetic layers.

DETAILED DESCRIPTION

The following description is presented to enable any person skilled in the art to make and use the claimed invention(s), and is provided in the context of particular application(s) and/or environment(s). Various modifications to the disclosed embodiments will be readily apparent to those skilled in the art, and the general principles defined herein may be applied to other embodiments and applications without departing from the spirit and scope of the disclosure. Thus, the disclosed subject matter is not limited to the embodiments shown, but is to be accorded the widest scope consistent with the principles and features disclosed herein.

In this disclosure, numerous specific details may be described to enable one or more of the embodiments. In the interest of not obscuring the presentation of the embodiments, some features that are known in the art may be combined together, may be described in less detail, or may be implied (i.e., some well-known features may not be explicitly described). Furthermore, while this description may refer to some features in the singular tense, more than one instance of the feature may be illustrated in the figures, and like components are labeled with like numerals.

Figure 1:
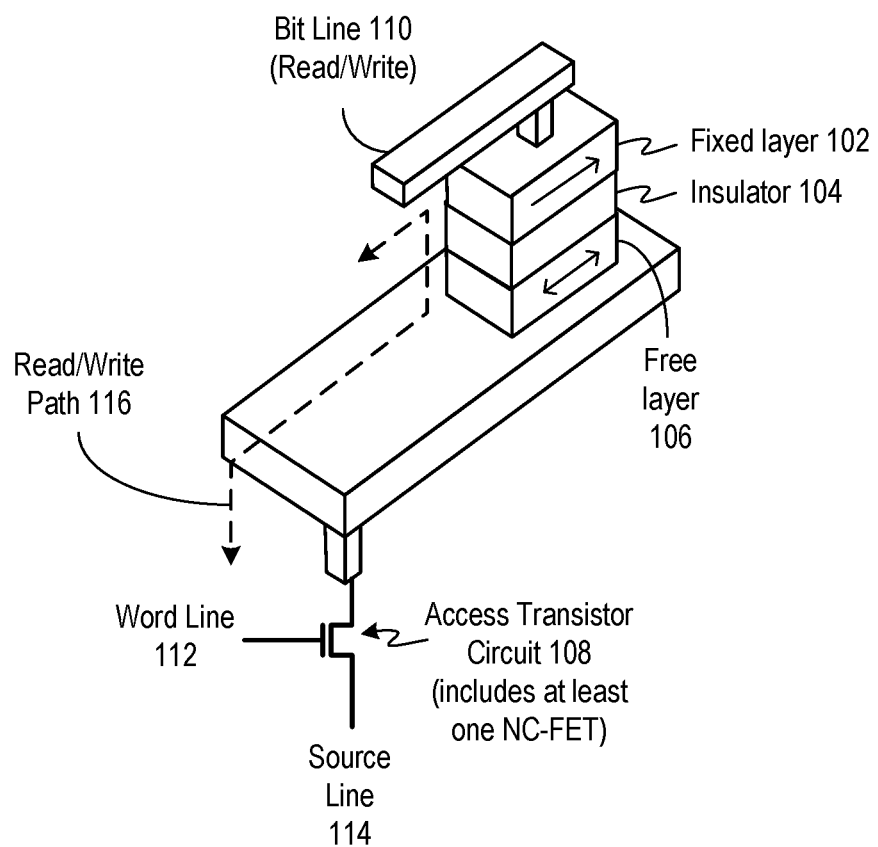
FIG. 1 illustrates an STT-MRAM bit cell having a access transistor circuit that includes at least one NC-FET in accordance with some embodiments described herein.

FIG. 1 illustrates an STT-MRAM bit cell having an access transistor circuit that includes at least one NC-FET in accordance with some embodiments described herein. The MTJ comprises fixed layer 102, insulator 104, and free layer 106. The electron spin direction in fixed layer 102 does not change, but the electron spin direction in free layer 106 can be changed by using an electric current. Note that, in FIG. 1, the current is injected perpendicular to the magnetization direction in the MTJ. The resistance of the MTJ depends on whether the spin direction in fixed layer 102 is parallel or antiparallel with respect to the spin direction in free layer 106. This difference in the resistance allows the MTJ to store a bit of information. The MTJ can be used as the basis for an MRAM bit cell by coupling the MTJ with access transistor circuit 108 that includes at least one NC-FET as shown in FIG. 1. Bit line 110, word line 112, and source line 114 of the resulting bit cell can be used to read and write the single bit that is stored in the MTJ. Read/write path 116 shows the direction of the current flow when a single bit is read from, or a single bit is written to, the MTJ.

Figure 2:
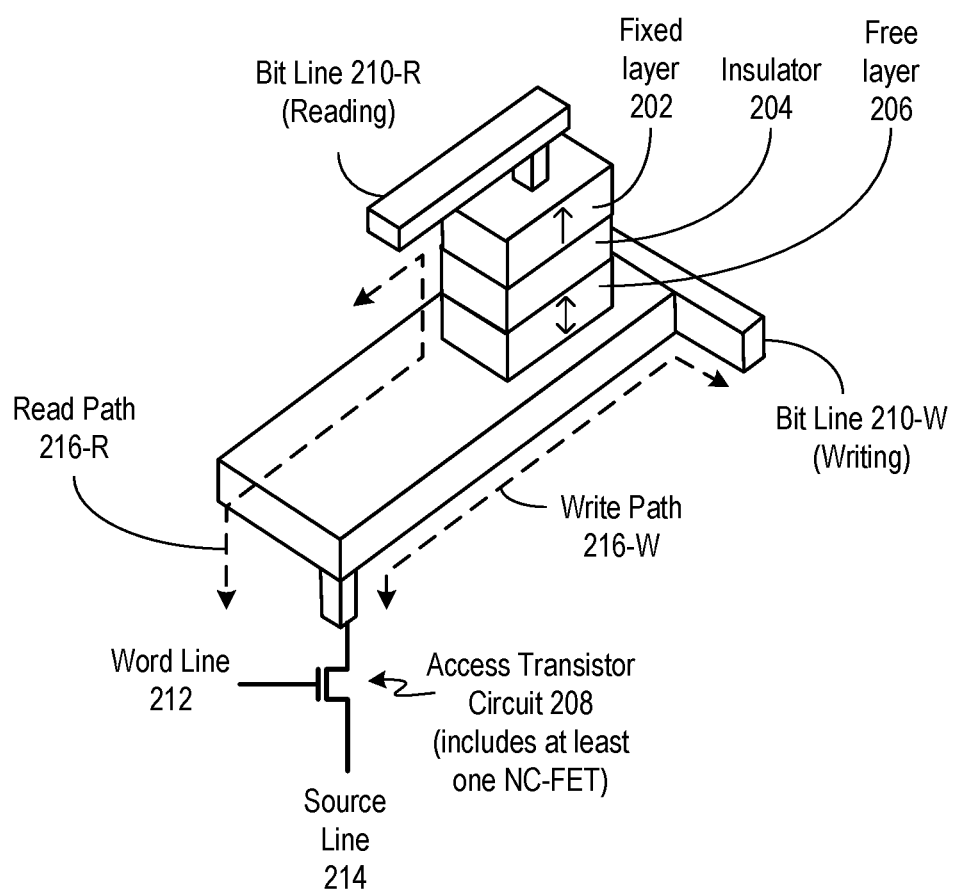
FIG. 2 illustrates an SOT-MRAM bit cell having a access transistor circuit that includes at least one NC-FET in accordance with some embodiments described herein.

FIG. 2 illustrates an SOT-MRAM bit cell having an access transistor circuit that includes at least one NC-FET in accordance with some embodiments described herein. The MTJ comprises fixed layer 202, insulator 204, and free layer 206. The electron spin direction in fixed layer 202 does not change, but the electron spin direction in free layer 206 can be changed by using an electric current. Note that, in FIG. 2, the current is injected in-plane to the magnetization direction in the MTJ (i.e., the injected current direction is not perpendicular as it was in FIG. 1; however, the injected current direction can be parallel or antiparallel with respect to the magnetization direction). The resistance of the MTJ depends on whether the spin direction in fixed layer 202 is parallel or antiparallel with respect to the spin direction in free layer 206. This difference in the resistance allows the MTJ to store a bit of information. The MTJ can be used as the basis for an MRAM bit cell by coupling the MTJ with access transistor circuit 208 that includes at least one NC-FET as shown in FIG. 2. Read bit line 210-R (which is used to read the bit stored in the MTJ), write bit line 210-W (which is used to read the bit stored in the MTJ), word line 212, and source line 214 of the resulting bit cell can be used to read and write the single bit that is stored in the MTJ. Read path 216-R shows the direction of the current flow when a single bit is read from the MTJ, and write path 216-W shows the direction of the current flow when a single bit is written to the MTJ.

Details of how an MTJ works, and techniques and systems for fabricating MTJs can be found in many documents, e.g., "Spin Transfer Torques," D. C. Ralph, M. D. Stiles, Journal of Magnetism and Magnetic Materials, vol. 320, no. 7, pp. 1190-1216, April 2008, the contents of which are herein incorporated by reference in their entirety for all purposes. Bit cell designs and memory architectures are well-known in the art, and details can be found in numerous publications. For example, details of bit cell designs and memory architectures can be found in (1) U.S. Pat. No. 9,583,208, and (2) "Integrated Circuits," by J. M. Rabaey, A. Chandrakasan, and B. Nikolic, Digital, 2nd ed. Prentice Hall/Pearson (2003), the contents of both of these documents are herein incorporated by reference in their entirety for all purposes.

Rapid advances in semiconductor miniaturization over several decades have allowed the exponential increase in integration densities according to Moore's law. However, the metal-oxide-semiconductor field-effect transistor (MOSFET) technology that the industry has relied on so far is running into hard limits that are dictated by physics, and which cannot be overcome by engineering. One such physical limit is based on the Boltzmann distribution of electrons, which creates a hard limit on how much one can keep reducing the operating voltage to reduce the power consumption. The upshot is that the theoretical minimum thermionic limit for a MOSFET's subthreshold slope characteristic is approximate 60 mV/decade at room temperature.

Unfortunately, a relatively large current can be required to switch the magnetization direction of the free layer in an MTJ (the exact value of the critical current level depends on the structure and the materials used to create the MTJ). Further details of the critical current required can be found in "Spin Transfer Torques," D. C. Ralph, M. D. Stiles, Journal of Magnetism and Magnetic Materials, vol. 320, no. 7, pp. 1190-1216, April 2008. Therefore, using conventional MOSFET access transistors can result in an unacceptably long write times when used in an STT-MRAM or SOT-MRAM.

A novel and non-obvious insight is realizing that (1) what is needed is a transistor that can provide a higher current for the same dynamic power budget, and (2) that an NC-FET can be used to provide a "bootstrap" or a spike of high current to rapidly flow through the tunnel junction of the bit cell. Specifically, an access transistor circuit that includes an NC-FET allows a narrower current distribution window than a conventional access transistor, allows higher current for same dynamic power budget and enables a fast write, and allows lower VDD operation for better static and dynamic power performance. Some embodiments described herein (see e.g., FIGS. 1 and 2) use an access transistor circuit that includes at least one NC-FET which reduces the write window, thereby allowing faster total access time for both read and write operations.

Further details on an NC-FET can be found in many publications, e.g., (1) "Negative capacitance detected," Catalan, G., Jimenez, D. and Gruverman, A., Nature Materials, vol. 14, pp. 137-139 (2015) and (2) "Use of Negative Capacitance to Provide Voltage Amplification for Low Power Nanoscale Devices," Sayeef Salahuddin and Supriyo Datta, Nano Letters, vol. 8, no. 2, pp. 405-410 (2008); the contents of these two publications are herein incorporated by reference in their entirety for all purposes. A hysteresis-free NC-FET implementation was reported in "Sub-60 mV-swing negative-capacitance FinFET without hysteresis," K.-S. Li, P.-G. Chen, T.-Y. Lai, C.-H. Lin, C.-C. Cheng, C.-C. Chen, Y.-J. Wei, Y.-F. Hou, M.-H. Liao, M.-H. Lee, M.-C. Chen, J.-M. Sheih, W.-K. Yeh, F.-L. Yang, S. Salahuddin, C. Hu, IEEE International Electron Devices Meeting (IEDM) Technical Digest, pp. 621-623, 2015, the contents of which are herein incorporated by reference in their entirety for all purposes.

Figure 3:
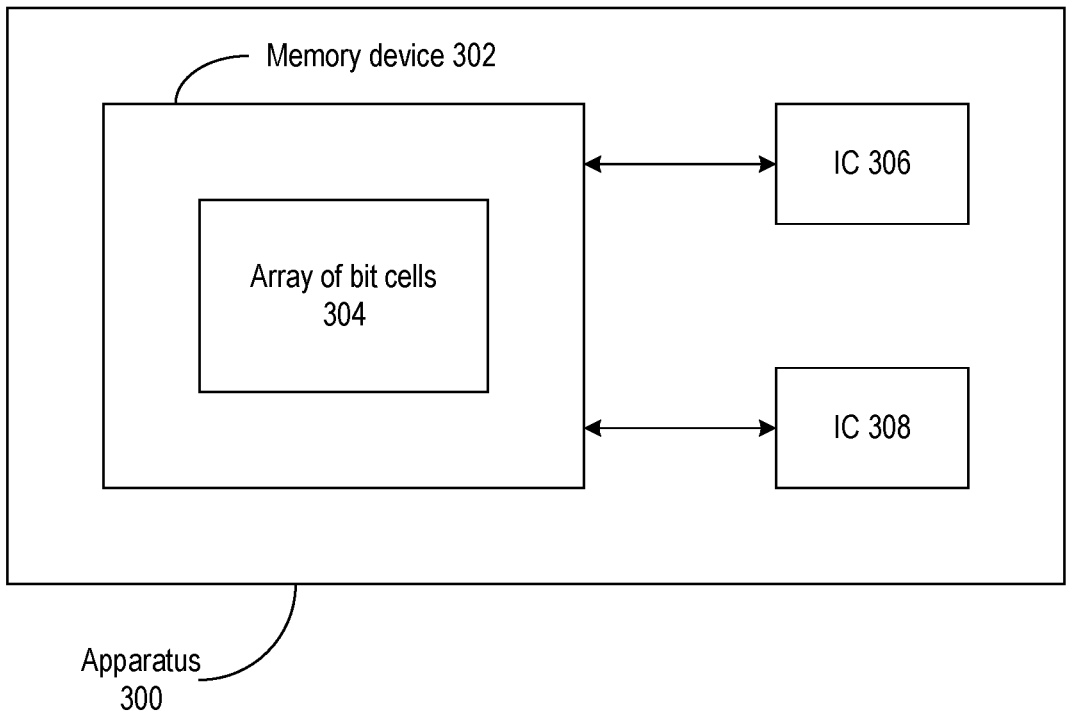
FIG. 3 illustrates an apparatus in accordance with some embodiments described herein.

FIG. 3 illustrates an apparatus in accordance with some embodiments described herein. Apparatus 300 can include memory device 302 and one or more ICs, such as ICs 306 and 308, which can perform various functions (e.g., IC 306 can be a central processing unit). ICs 306 and 308 can access memory device 302 via a communication mechanism, e.g., a bus. Memory device 302 can include an array of bit cells 304 and other circuitry to facilitate reading data from, and writing data to, the array of bit cells 304.

Each bit cell in array of bit cells 304 can be implemented in accordance with embodiments disclosed herein, e.g., each bit cell in array of bit cells 304 can be implemented as shown and explained in reference to FIGS. 1 and 2. Specifically, a bit cell can comprise an MTJ and an access transistor circuit coupled to the MTJ, wherein the access transistor circuit comprises an NC-FET. The NC-FET can optionally be coupled, in parallel, with additional transistors to achieve a set of desired electrical characteristics for the access transistor circuit. Specifically, in some embodiments, the access transistor circuit can comprise a PMOS or an NMOS field-effect transistor that is coupled in parallel with the NC-FET (i.e., the gate, source, and drain terminals of the PMOS or NMOS transistor can be coupled with the respective gate, source, and drain terminals of the NC-FET).

In some embodiments, the MTJ includes a floating (or free) magnetic layer, one or more fixed magnetic layers, and one or more insulating layers disposed between adjacent magnetic layers. The embodiments shown in FIGS. 1 and 2 illustrate an insulator disposed between a single floating magnetic layer and a single fixed magnetic layer. In other embodiments, the MTJ stack can include a floating magnetic layer between two fixed magnetic layers, wherein an insulating layer (i.e., a thin non-conducting layer) is disposed between adjacent magnetic layers.

In some embodiments, a direction of injected current in the MTJ is perpendicular to a magnetization direction of the one or more fixed magnetic layers. See e.g., the STT-MRAM bit cell shown in FIG. 1. In some embodiments, a direction of injected current in the MTJ is parallel or antiparallel to a magnetization direction of the one or more fixed magnetic layers. See e.g., the SOT-MRAM bit cell shown in FIG. 2.

Figure 4:
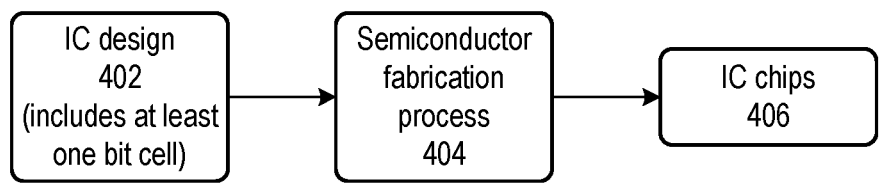
FIG. 4 illustrates how a semiconductor fabrication process can be used to produce an IC chip based on an IC design that includes at least one bit cell in accordance with some embodiments described herein.

FIG. 4 illustrates how a semiconductor fabrication process can be used to produce an IC chip based on an IC design that includes at least one bit cell in accordance with some embodiments described herein. IC design software tools can be used to create IC design 402 that includes at least one bit cell comprising an MTJ and an NC-FET (e.g., as shown in FIGS. 1 and 2). Once the IC design is finalized, it can be provided to semiconductor fabrication process 404 to produce IC chips 406. Specifically, IC design 402 can include details for fabricating a bit cell, and when IC design 402 is provided to semiconductor fabrication process 404, it can cause semiconductor fabrication process 404 to fabricate a bit cell by (1) fabricating an MTJ, and (2) fabricating an access transistor circuit coupled to the MTJ, wherein the access transistor circuit comprises an NC-FET.

The overall IC design and manufacturing process can involve multiple entities, e.g., one company may create the software for designing ICs, another company may use the software to create the IC design, and yet another company may manufacture IC chips based on the IC design. An IC design flow can include multiple steps, and each step can involve using one or more IC design software tools. As an IC design progresses through an IC design flow, the IC design can be represented at different levels of abstraction by using different data formats or languages. In general, higher levels of abstraction contain fewer details of the IC design than lower levels of abstraction. Typically, the IC design is described at a high level of abstraction in the early stages of the IC design flow, and the level of abstraction becomes progressively lower as the IC design moves through the IC design flow (i.e., the description of the IC design becomes more specific as the IC design progresses through the IC design flow).

For example, toward the beginning of the IC design flow, an IC design can be described at a high level of abstraction by using a hardware description language (HDL) which describes the functionality of the IC design but does not include information about the actual geometric shapes that will be printed on the wafer. Toward the end of the IC design flow, the same IC design can be represented in a low level of abstraction by using a data format or language such as GDSII or OASIS, which contains a description of the actual geometric shapes that are to be printed on the wafer. In between these two ends of the IC design flow, the IC design may be represented in numerous data formats or languages that describe the same IC design at different levels of abstraction.

IC design software tools enable IC designers to describe the functionality that the IC designers want to implement. These tools also enable IC designers to perform what-if planning to refine functionality, check costs, etc. During logic design and functional verification, the HDL, e.g., SystemVerilog, code can be written and the design can be checked for functional accuracy, e.g., the design can be checked to ensure that it produces the correct outputs. During synthesis and design for test, the HDL code can be translated to a netlist using one or more IC design software tools. Further, the netlist can be optimized for the target technology, and tests can be designed and implemented to check the finished chips. During netlist verification, the netlist can be checked for compliance with timing constraints and for correspondence (i.e., equivalence checking) with the RTL design and/or HDL code. During design planning, an overall floorplan for the chip can be constructed and analyzed for timing and top-level routing. During physical implementation, circuit elements can be positioned in the layout and can be electrically connected. During analysis and extraction, the IC design's functionality can be verified at a transistor level and parasitics can be extracted. During physical verification, the design can be checked to ensure correctness for manufacturing, electrical issues, lithographic issues, and circuitry. During resolution enhancement, geometric manipulations can be performed on the layout to improve manufacturability of the design. Finally, during mask data preparation, the design can be "taped out" to produce masks which can then be used in the semiconductor fabrication process to produce IC chips.

Figure 5:
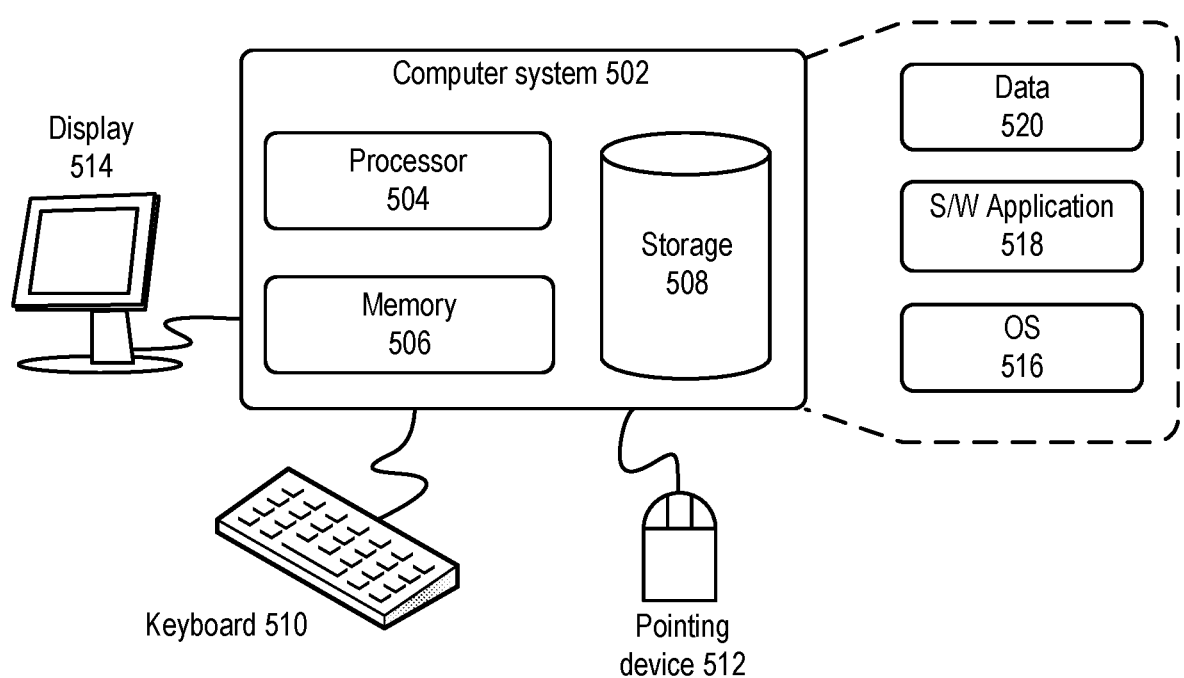
FIG. 5 illustrates a computer system in accordance with some embodiments described herein.

FIG. 5 illustrates a computer system in accordance with some embodiments described herein. The term "computer" or "computer system" generally refers to a hardware-based system that can perform computations required for the design and manufacture of ICs. Computer system 502 can include processor 504, memory 506, and storage device 508. Computer system 502 may include multiple processors, and processor 504 may include multiple cores. Specifically, memory locations in memory 506 can be addressable by processor 504, thereby enabling processor 504 to access (e.g., via load/store instructions) and manipulate (e.g., via logical/floating point/arithmetic instructions) the data stored in memory 506. Computer system 502 can be coupled to display device 514, keyboard 510, and pointing device 512. Storage device 508 can store operating system 516, software application 518, and data 520. Data 520 can include input required by software application 518 and/or output generated by software application 518.

Computer system 502 may automatically (or with user help) perform one or more operations that are implicitly or explicitly described in this disclosure. Specifically, computer system 502 can load software application 518 into memory 506, and software application 518 can then be used to create an IC design that includes a bit cell in accordance with embodiments described herein (e.g., the bit cells shown in FIGS. 1 and 2).

While 'data' and 'information' often are used interchangeably (e.g., 'data processing' and 'information processing'), the term 'datum' (plural 'data') typically signifies a representation of the value of a measurement of a physical quantity (e.g., the current in a wire), or the answer to a question (e.g., "yes" or "no"), while the term 'information' typically signifies a structured set of data (often times signified by 'data structure'). A specified data structure is used to structure an electronic device to be used as a specific machine as an article of manufacture (see In re Lowry, 32 F.3d 1579 [CAFC, 1994]). Data and information are physical, for example binary data (a 'bit', usually signified with '0' and '1') enabled with two different levels of voltage in a circuit. For example, data can be enabled as an electrical, magnetic, optical or acoustical signal; a quantum state such as spin that enables a 'qubit'; or a physical state of an atom or molecule. All such data and information, when enabled, are stored, accessed, transferred, combined, compared, or otherwise acted upon, actions that require energy.

As used herein, the term 'process' signifies an unnatural sequence of physical actions and/or transformations (both also referred to as 'operations' or 'steps') to produce at least one result. The actions and transformations are technical applications of one or more natural laws of science or unnatural laws of technology. The actions and transformations often change the physical state of a machine, of structures of data and information, or of a composition of matter. Two or more actions can occur at about the same time, or one action can occur before or after another action, if they produce the same result. A description of the physical actions and/or transformations that comprise a process are often signified with a set of gerund phrases (or their semantic equivalents) that are typically preceded with the signifier 'the steps of' (e.g., "a process comprising the steps of measuring, transforming, partitioning and then distributing . . . "). The signifiers 'algorithm', 'method', 'procedure', '(sub)routine', 'protocol', 'recipe', and 'technique' often are used interchangeably with 'process', and 35 U.S.C. 100 defines a "method" as one type of process that is, by statutory law, always patentable under 35 U.S.C. 101. Many forms of knowledge, learning, skills and styles are authored, structured, and enabled—objectively—as processes—e.g., knowledge and learning as functions in knowledge programming languages. As used herein, the term 'rule' signifies a process with at least one conditional test (signified, e.g., by 'IF test THEN process'). As used herein, the term 'thread' signifies a sequence of operations or instructions that comprise a subset of an entire process. A process can be partitioned into multiple threads that can be used at or about at the same time.

As used herein, the term 'component' (also signified by 'part', and typically signified by 'element' when described in a patent text or diagram) signifies a physical object that is used to enable a process in combination with other components. For example, electronic components are used in processes that affect the physical state of one or more ('ensemble') electromagnetic or quantum particles/waves (e.g., electrons, photons) or quasiparticles (e.g., electron holes, phonons, magnetic domains) and their associated fields or signals. Electronic components have at least two connection points to which are attached 'leads', typically a wire with one end attached to the component and the other end attached to another component, typically as part of a circuit with current flows. There are at least three types of electrical components: passive, active and electromechanical. Passive electronic components typically do not introduce energy into a circuit—such components include resistors, memristors, capacitors, magnetic inductors, crystals, Josephson junctions, transducers, sensors, antennas, waveguides, etc. Active electronic components require a source of energy and can inject energy into a circuit—such components include semiconductors (e.g., diodes, transistors, optoelectronic devices), vacuum tubes, batteries, power supplies, displays (e.g., LEDs, LCDs, lamps, CRTs, plasma displays). Electromechanical components affect current flow using mechanical forces and structures—such components include switches, relays, protection devices (e.g., fuses, circuit breakers), heat sinks, fans, cables, wires, terminals, connectors and printed circuit boards. As used herein, the term 'netlist' is a specification of the components comprising an electric circuit, and electrical connections between the components. The programming language for the SPICE circuit simulation program is often used to specify a netlist. In the context of circuit design, the term 'instance' signifies each time a component is specified in a netlist.

One of the most important components as goods in commerce is the integrated circuit, and its res of abstractions. As used herein, the term 'integrated circuit' signifies a set of connected electronic components on a small substrate (thus the use of the signifier 'chip') of semiconductor material, such as silicon or gallium arsenide, with components fabricated on one or more layers. Other signifiers for 'integrated circuit' include 'monolithic integrated circuit', 'IC', 'chip', 'microchip' and 'System on Chip' ('SoC'). Types of integrated circuits include gate/logic arrays, processors, memories, interface chips, power controllers, and operational amplifiers. The term 'cell' as used in electronic circuit design signifies a specification of one or more components, for example, a set of transistors that are connected to function as a logic gate. Cells are usually stored in a database, to be accessed by circuit designers and design processes.

As used herein, the term 'module' signifies a tangible structure for acting on data and information that typically is limited in size and/or complexity. For example, the term 'module' can signify one or more processes that transforms data and information, for example, processes comprising a computer program. The term 'module' also can signify one or more interconnected electronic components, such as digital logic devices. A process comprising a module, if specified in a programming language, such as System C or Verilog, also can be transformed into a specification for a structure of electronic components that transform data and information that produce the same result as the process. This last sentence follows from a modified Church-Turing thesis, which is simply expressed as "Whatever can be transformed by a (patentable) process and a processor, can be transformed by a (patentable) equivalent set of modules.", as opposed to the doublethink of deleting only one of the "(patentable)".

A module is permanently structured (e.g., circuits with unalterable connections), temporarily structured (e.g., circuits or processes that are alterable with sets of data), or a combination of the two forms of structuring. Permanently structured modules can be manufactured, for example, using Application Specific Integrated Circuits ('ASICs') such as Arithmetic Logic Units ('ALUs'), Programmable Logic Arrays ('PLAs'), or Read Only Memories ('ROMs'), all of which are typically structured during manufacturing. For example, a permanently structured module can comprise an integrated circuit. Temporarily structured modules can be manufactured, for example, using Field Programmable Gate Arrays (FPGAs—for example, sold by Xilink or Intel's Altera), Random Access Memories (RAMs) or microprocessors. For example, data and information is transformed using data as an address in RAM or ROM memory that stores output data and information. One can embed temporarily structured modules in permanently structured modules (for example, a FPGA embedded into an ASIC).

Modules that are temporarily structured can be structured during multiple time periods. For example, a processor comprising one or more modules has its modules first structured by a manufacturer at a factory and then further structured by a user when used in commerce. The processor can comprise a set of one or more modules during a first time period, and then comprise a different set of one or modules during a second time period. The decision to manufacture or implement a module in a permanently structured form, in a temporarily structured form, or in a combination of the two forms, depends on issues of commerce such as cost, time considerations, resource constraints, tariffs, maintenance needs, national intellectual property laws, and/or specific design goals. How a module is used is mostly independent of the physical form in which it is manufactured or enabled. This last sentence also follows from the modified Church-Turing thesis.

As used herein, the term 'processor' signifies a tangible data and information processing machine for use in commerce that physically transforms, transfers, and/or transmits data and information, using at least one process. A processor consists of one or more modules (e.g., a central processing unit, 'CPU'; an input/output ('I/O') controller, a memory controller, a network controller, and other modules). The term 'processor' can signify one or more processors, or one or more processors with multiple computational cores/CPUs, specialized processors (for example, graphics processors or signal processors), and their combinations. Where two or more processors interact, one or more of the processors can be remotely located. Where the term 'processor' is used in another context, such as a 'chemical processor', it will be signified and defined in that context.

The processor can comprise, for example, digital logic circuitry (for example, a binary logic gate), and/or analog circuitry (for example, an operational amplifier). The processor also can use optical signal processing, DNA transformations or quantum operations, microfluidic logic processing, or a combination of technologies, such as an optoelectronic processor. For data and information structured with binary data, any processor that can transform data and information using the AND, OR and NOT logical operations (and their derivatives, such as the NAND, NOR, and XOR operations) also can transform data and information using any function of Boolean logic. A processor such as an analog processor, such as an artificial neural network, also can transform data and information. No scientific evidence exists that any of these technological processors are processing, storing and retrieving data and information, using any process or structure equivalent to the bioelectric structures and processes of the human brain.

The one or more processors also can use a process in a 'cloud computing' environment, where time and resources of multiple remote computers are shared by multiple users or processors communicating with the computers. For example, a group of processors can use at least one process available at a distributed or remote system, these processors using a communications network (e.g., the Internet, or an Ethernet) and using one or more specified interfaces (e.g., an application program interface ('API') that signifies functions and data structures to communicate with the remote process).

As used herein, the term 'computer' and 'computer system' (further defined below) includes at least one processor that, for example, performs operations on data and information such as (but not limited to) the AND, OR and NOT logical operations using electronic gates that can comprise transistors, with the addition of memory (for example, memory structured with flip-flops using the NOT-AND or NOT-OR operation). Such a processor is Turing-complete and computationally universal. A computer can comprise a simple structure, for example, comprising an I/O module, a CPU, and a memory that performs, for example, the process of inputting a signal, transforming the signal, and outputting the signal with no human intervention.

As used herein, the term 'programming language' signifies a structured grammar for specifying sets of operations and data for use by modules, processors and computers. Programming languages include assembler instructions, instruction-set-architecture instructions, machine instructions, machine dependent instructions, microcode, firmware instructions, state-setting data, or either source code or object code written in any combination of one or more higher level languages, for example, the C programming language and similar general programming languages (such as Fortran, Basic, Javascript, PHP, Python, C++), knowledge programming languages (such as Lisp, Smalltalk, Prolog, or CycL), electronic structure programming languages (such as VHDL, Verilog, SPICE or SystemC), text programming languages (such as SGML, HTML, or XML), or audiovisual programming languages (such as SVG, MathML, X3D/VRML, or MIDI), and any future equivalent programming languages. As used herein, the term 'source code' signifies a set of instructions and data specified in text form using a programming language. A large amount of source code for use in enabling any of the claimed inventions is available on the Internet, such as from a source code library such as Github.

As used herein, the term 'program' (also referred to as an 'application program') signifies one or more processes and data structures that structure a module, processor or computer to be used as a "specific machine" (see In re Alappat, 33 F3d 1526 [CAFC, 1991]). One use of a program is to structure one or more computers, for example, standalone, client or server computers, or one or more modules, or systems of one or more such computers or modules. As used herein, the term 'computer application' signifies a program that enables a specific use, for example, to enable text processing operations, or to encrypt a set of data. As used herein, the term 'firmware' signifies a type of program that typically structures a processor or a computer, where the firmware is smaller in size than a typical application program, and is typically not very accessible to or modifiable by the user of a computer. Computer programs and firmware are often specified using source code written in a programming language, such as C. Modules, circuits, processors, programs, and computers can be specified at multiple levels of abstraction, for example, using the SystemC programming language, and have value as products in commerce as taxable goods under the Uniform Commercial Code (see U.C.C. Article 2, Part 1).

A program is transferred into one or more memories of the computer or computer system from a data and information device or storage system. A computer system typically has a device for reading storage media that is used to transfer the program, and/or has an interface device that receives the program over a network. This process is discussed in the General Computer Explanation section.

The signifier 'commercial solution' signifies, solely for the following paragraph, an engineering domain-specific (and thus non-preemptive—see Bilski): electronic structure, a process for a specified machine, a manufacturable circuit (and their Church-Turing equivalents) or a composition of matter that applies science and/or technology in commerce to solve a technical problem.

The signifier 'abstract' (when used in a patent claim for any enabled embodiments disclosed herein for a new commercial solution that is a scientific use of one or more laws of nature {see Benson}, and that solves a problem of technology {see Diehr} used in commerce—or improves upon an existing commercial solution {see Diehr})—is precisely defined by the inventor(s) {see MPEP 2111.01 (9th edition, Rev. 08.2017)} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is 'difficult to understand' {see Merriam-Webster definition for 'abstract'} how the commercial solution differs from equivalent prior art solutions; or b) a new commercial solution is 'abstract' if it is obvious, that is, if the existing prior art includes at least one analogous prior art solution {see KSR}, or the existing prior art includes at least two prior art publications that can be combined {see Alice} by a skilled person {often referred to as a 'PHOSITA', see MPEP 2141-2144 (9th edition, Rev. 08.2017)} to be equivalent to the new commercial solution, and is thus unpatentable under 35 U.S.C. 103, for example, because it is 'difficult to understand' how the new commercial solution differs from a PHOSITA-combination/-application of the existing prior art; or c) a new commercial solution is 'abstract' if it is not disclosed with a description that enables its praxis, either because insufficient guidance exists in the description, or because only a generic implementation is described {see Mayo} with unspecified components, parameters or functionality, so that a PHOSITA is unable to instantiate an embodiment of the new solution for use in commerce, without, for example, requiring special programming {see Katz} (or, e.g., circuit design) to be performed by the PHOSITA, and is thus unpatentable under 35 U.S.C. 112, for example, because it is 'difficult to understand' how to use in commerce any embodiment of the new commercial solution.

The Detailed Description signifies in isolation the individual features, structures, functions, or characteristics described herein and any combination of two or more such features, structures, functions or characteristics, to the extent that such features, structures, functions or characteristics or combinations thereof are enabled by the Detailed Description as a whole in light of the knowledge and understanding of a skilled person, irrespective of whether such features, structures, functions or characteristics, or combinations thereof, solve any problems disclosed herein, and without limitation to the scope of the Claims of the patent. When an embodiment of a claimed invention comprises a particular feature, structure, function or characteristic, it is within the knowledge and understanding of a skilled person to use such feature, structure, function, or characteristic in connection with other embodiments whether or not explicitly described, for example, as a substitute for another feature, structure, function or characteristic.

In view of the Detailed Description, a skilled person will understand that many variations of the claimed inventions can be enabled, such as function and structure of elements, described herein while remaining in the domain of the claimed inventions. One or more elements of an embodiment can be substituted for one or more elements in another embodiment, as will be understood by a skilled person. Writings about embodiments signify their uses in commerce, thereby enabling other skilled people to similarly use in commerce.

This Detailed Description is fitly written to provide knowledge and understanding. It is neither exhaustive nor limiting of the precise structures described, but is to be accorded the widest scope consistent with the disclosed principles and features. A skilled person can enable many equivalent variations. Without limitation, any and all equivalents described, signified or Incorporated By Reference in this patent application are specifically Incorporated By Reference into the Detailed Description. In addition, any and all variations described, signified or Incorporated By Reference with respect to any one claimed invention and its embodiment also are included with all other claimed inventions and their embodiments. Any such variations include both currently known variations as well as future variations, for example any element used for enablement includes a future equivalent element that provides the same function, regardless of the structure of the future equivalent element.

It is intended that the domain of the set of claimed inventions and their embodiments be defined and judged by the following Claims and their equivalents. The Detailed Description includes the following Claims, with each Claim standing on its own as a separate claimed invention. The embodiments of the claimed inventions can have more structure and features than are explicitly specified in the Claims.

The foregoing embodiments have been presented for purposes of illustration and description. They are not intended to be exhaustive or to limit the scope of this disclosure to the forms disclosed. Accordingly, many modifications and variations will be apparent to practitioners skilled in the art. Additionally, the above disclosure is not intended to limit the disclosed subject matter. The scope of the claimed invention(s) is defined by the appended claims.

What is claimed is:

1. A bit cell, comprising:
    a magnetic tunnel junction (MTJ), wherein the MTJ Includes a floating magnetic layer, one or more fixed magnetic layers, and one or more insulating layers deposed between adjacent magnetic layers, and wherein a direction of injected current In the MTJ is perpendicular to a magnetization direction of the one or more fixed magnetic layers; and
    an access transistor circuit coupled to the MTJ, the access transistor circuit comprising (1) a negative-capacitance field-effect-transistor (NC-FET), and (2) a p-type metal-oxide-semiconductor (PMOS) field-effect transistor or on n-type metal-oside-semiconductor (NMOS) field-effect transistor that is coupled in parallel with the NC-FET.

2. A memory device, comprising:
    an array of bit cells, each bit cell comprising:
        a magnetic tunnel junction (MTJ), wherein the MTJ includes a floating magnetic layer, one or more fixed magnetic layers, and one or more insulating layers disposed between adjacent magnetic layers, and therein a direction of injected current in she MTJ is parallel or antiparallel to a magnetization direction of the one or more fixed magnetic layers; and
        an access transistor circuit coupled to the MTJ, the access transistor circuit comprising (1) a negative-capacitance field-effect-transistor (NC-FET), an (2) a p-type metal-oxide-semiconductor (PMOS) field-effect transistor or an n-type metal-oxide-semiconductor (NMOS) field-effect transistor or that is coupled in parallel wish the NC-FET.

3. A bit cell, comprising:

a magnetic tunnel junction (MTJ), wherein the MTJ includes a floating magnetic layer, one or more fixed magnetic layers, and one or more insulating layers disposed between adjacent magnetic layers, and wherein a direction of injected current in the MTJ is parallel or antiparallel to a magnetization direction of the one or more fixed magnetic layers; and an access transistor circuit coupled to the MTJ, the access transistor circuit comprising (1) a negative-capacitance field-effect-transistor (NC-FET), and (2) a p-type metal-oxide-semiconductor (PMOS) field-effect transistor or an n-type metal-oxide-semiconductor (NMOS) field-effect transistor that is coupled in parallel with the NC-FET.

* * * * *